US012763766B2

(12) United States Patent
Hudetz et al.

(10) Patent No.: US 12,763,766 B2
(45) Date of Patent: Oct. 13, 2026

(54) SWITCHING DEVICE FOR OPERATION WITH DIFFERENT INPUT CONTROL VOLTAGES

(71) Applicant: Phoenix Contact GmbH & Co. KG, Blomberg (DE)

(72) Inventors: Hans-Peter Hudetz, Hameln (DE); Elmar Schaper, Lügde (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 19/139,672

(22) PCT Filed: Dec. 14, 2023

(86) PCT No.: PCT/EP2023/085853

§ 371 (c)(1),
(2) Date: Jun. 16, 2025

(87) PCT Pub. No.: WO2024/126700

PCT Pub. Date: Jun. 20, 2024

(65) Prior Publication Data

US 2026/0213743 A1 Jul. 23, 2026

(30) Foreign Application Priority Data

Dec. 16, 2022 (BE) .................................. 2022/6022

(51) Int. Cl.
*H03K 17/10* (2006.01)

(52) U.S. Cl.
CPC .................................. *H03K 17/10* (2013.01)

(58) Field of Classification Search
CPC .................................................... H03K 17/10
See application file for complete search history.

(56) References Cited

U.S. PATENT DOCUMENTS 6,504,698 B1 1/2003 Durif et al.
2009/0256534 A1 10/2009 Videtich et al.
(Continued)

FOREIGN PATENT DOCUMENTS

DE 102016100188 A1 * 7/2017 .............. H02H 1/06
EP 3375004 B1 9/2018

OTHER PUBLICATIONS

English Translation of Written Opinion issued in PCT Application No. PCT/EP2023/085853, Mar. 27, 2024, 8 pp.
(Continued)

*Primary Examiner* — Robert L Deberadinis
(74) *Attorney, Agent, or Firm* — Kaplan Breyer Schwarz, LLP

(57) ABSTRACT

A switching device for operating with different input control voltages, includes a current measurement path connected to the input terminals of the switching device, which has a predetermined electrical resistor and a current sensor connected in series therewith. The current value measured by the current sensor is fed to a control and evaluation device, which determines a voltage value depending on the predetermined electrical resistor and the measured current value and checks whether the determined voltage value can be associated with a predetermined input control voltage value from a plurality of stored predetermined input control voltage values. If so, the switch-on and switch-off threshold voltage values associated with this input control voltage value are made available to the control and evaluation device for further operation of the switching device.

14 Claims, 2 Drawing Sheets

(56) References Cited

U.S. PATENT DOCUMENTS

| | | | |
|---|---|---|---|
| 2010/0027183 | A1 | 2/2010 | Di Maio et al. |
| 2018/0076731 | A1 | 3/2018 | Morin |
| 2020/0194205 | A1 | 6/2020 | Buescher et al. |

OTHER PUBLICATIONS

Authorized Officer: O'Reilly, Siobhan, International Search report issued in PCT Application No. PCT/EP2023/085853, Mar. 27, 2024, 2 pp.

* cited by examiner

SWITCHING DEVICE FOR OPERATION WITH DIFFERENT INPUT CONTROL VOLTAGES

FIELD

The present invention relates to a switching device which is particularly suitable for operating with different input control voltages.

BACKGROUND

Switching devices are characterized, among other things, by the fact that at a specified input control voltage they ensure that a relay or contactor is switched on above a specified switch-on voltage threshold and switched off when the voltage falls below a specified switch-off voltage threshold. Switching devices that can be operated with different input control voltages are known. Common input control voltages on the market are 24 V, 48 V, 60 V, 120 V and 230 V. The input control voltages can be either AC voltages or DC voltages.

Such a switching device is known, for example, from EP 3 375 004 B1. The known switching device is designed for several different rated voltage ranges, ranging from approximately 24 volts to 240 volts. The known switching device has a control unit which measures the output voltage of a rectifier supplied to it on the input side and evaluates the measured voltage by the control unit determining in which of predetermined voltage ranges the measured control voltage lies. A lower switch-on voltage threshold and an upper switch-off voltage threshold are then adjusted depending on the predetermined voltage range determined.

SUMMARY

The object of the present invention is to provide an alternative switching device that can be operated with several different input control voltages, in which the susceptibility to interference from external influences can be minimized.

A main idea of the invention can be seen in providing a switching device that configures itself in particular depending on an applied input control voltage. For this purpose, an input control voltage applied to the switching device is not fed directly to a control and evaluation device. Instead, the current is measured in a current path connected to the input terminals of the switching device, which comprises a series connection of an electrical resistor with a predetermined resistance value and a current sensor, wherein the measured current value is fed to the control and evaluation device, which then determines a voltage value depending on the predetermined resistance value of the electrical resistor and the measured current value and checks whether the determined voltage value can be associated with a predetermined input control voltage value out of a plurality of predetermined input control voltage values stored in the switching device. If so, the switch-on and switch-off threshold voltage values associated with this input control voltage value are made available to the control and evaluation device for further operation of the switching device.

The above-mentioned technical problem is solved by the features of claim 1.

Accordingly, a switching device is provided, in particular a self-learning switching device, which is configured in particular for operating with different input control voltages. The switching device preferably has the following features:

- a first and a second input terminal for applying an input control voltage,
- a current measurement path connected to the first and second input terminals, which comprises a predetermined electrical resistor, i.e. an electrical resistor with a predetermined resistance value, and a current sensor connected in series with it, which is configured to measure a current flowing through the current path,
- a switching unit—for example an electromechanical switch or an optocoupler-which is configured to close and open at least one load circuit and which is electrically connected to a control circuit,
- a controllable switching element which is configured to close and open the control circuit,
- a control and evaluation device which has a first input which is electrically connected to the current sensor,
- a memory device which is electrically connected to the control and evaluation device and in which an assignment table is stored, which assigns a switch-on voltage threshold value and a switch-off voltage threshold value to each predetermined input control voltage value from a plurality of n different predetermined input control voltage values, wherein the control and evaluation device is configured to
- i) determine a voltage value depending on a current value measured by the current sensor and the predetermined electrical resistor and check whether the determined voltage value can be associated with one of the n different predetermined input control voltage values, and if so
- ii) depending on the predetermined input control voltage value associated with the determined voltage value, read out the associated switch-on voltage threshold value and the associated switch-off voltage threshold value from the memory device and provide them as the current switch-on and switch-off threshold value, respectively.

Advantageous embodiments and configurations are the subject matter of the dependent claims.

For example, the switching device comprises a voltage supply device with a first and a second output, wherein the voltage supply device is configured to generate a first predetermined DC supply voltage and a second predetermined DC supply voltage when an input control voltage is applied to the first and second input terminals and to provide the first predetermined DC supply voltage at the first output and the second predetermined DC supply voltage at the second output, wherein

- the control and evaluation device has a voltage supply terminal which is electrically connected to the second output of the voltage supply device. The switching unit is connected to the first output via the control circuit.

For activating and deactivating the switching unit, the control and evaluation device is preferably configured to generate an activation signal if, after execution of step ii), a voltage value determined by the control and evaluation device depending on a current value measured by the current sensor is greater than or equal to the switch-on voltage threshold value stored as current, wherein

- the controllable switching element is configured to close the control circuit in response to the activation signal, and wherein
- the control and evaluation device is configured to generate a deactivation signal if, after execution of step ii), a voltage value determined by the control and evaluation device depending on a current value measured by the current sensor is less than or equal to the currently stored switch-off voltage threshold value, wherein the controllable switching element is configured to open the control circuit in response to the deactivation signal.

According to an advantageous embodiment, the controllable switching element can be an integral component of the control and evaluation device. In this case, the controllable switching element preferably forms an open collector output of the control and evaluation device.

According to an alternative advantageous embodiment, the controllable switching element can be provided as a separate component, wherein the control and evaluation device has a control output for applying the activation signal or the deactivation signal, and wherein the control output is electrically connected to a terminal of the controllable switching element.

The switching device preferably is a self-learning switching device. This is advantageously achieved by the control and evaluation device being configured to continuously determine a voltage value depending on a current value measured by the current sensor after carrying out steps i) and ii) and to check whether this determined voltage value can be associated with a different one of the n different predetermined input control voltage values, and if this is the case, to read out the associated switch-on voltage threshold value and the associated switch-off voltage threshold value from the memory device depending on the predetermined input control voltage value associated with the determined voltage value and to provide or store these values as new current switch-on and switch-off voltage threshold values. respectively. In this way, the switch-on and switch-off voltage threshold values are automatically adjusted during operation of the switching device.

According to an advantageous embodiment, the switching device can comprise a third input terminal, which is electrically connected to a second input of the control and evaluation device. The control and evaluation device is then preferably configured to delete the currently stored or provided switch-on and switch-off voltage threshold values in response to a first control signal that can be applied to the third input terminal and then to repeat steps i) and ii). This measure allows the switch-on and switch-off voltage threshold values to be reset and the switching device to be restarted in order to readjust the switch-on and switch-off voltage threshold values with respect to a different input control voltage.

In order to enable an operator to find out the currently valid switch-on and switch-off voltage threshold values at any time, the switching device can have an optical and/or acoustic output device. In this case, the control and evaluation device can be configured to cause the switching device to output optical and/or acoustic information via the optical and/or acoustic output device, which represents the currently stored switch-on and switch-off threshold values and/or the associated predetermined input control voltage value.

According to an advantageous embodiment, the control and evaluation device can be configured to cause the switching device, in response to a second control signal that can be applied to the third input terminal, to output, via the optical and/or acoustic output device, optical and/or acoustic information, which represents the currently provided or stored switch-on and switch-off voltage threshold values and/or the associated predetermined input control voltage value.

The controllable switching element preferably is a semiconductor switch, wherein the switching unit can be provided as an electromechanical switch, e.g. as a relay or contactor, or as an optocoupler. Preferably, the electromechanical switch is configured as an on/off switch or as a changeover switch.

Expediently, the switching device has at least two output terminals connected to the electromechanical switch for connecting at least one load circuit.

The electromechanical switch can, for example, have an excitation coil connected in series with the controllable switching element.

The control and evaluation device can preferably be provided as a microcontroller.

Advantageously, the storage device can be an integral component of the control and evaluation device.

If the memory device is a separate component, it can, for example, be a non-volatile, electronic memory module, such as for example an EEPROM.

BRIEF DESCRIPTION OF THE DRAWINGS

The invention is described in detail below with reference to the accompanying drawings. In the drawings.

DETAILED DESCRIPTION

Figure 1:
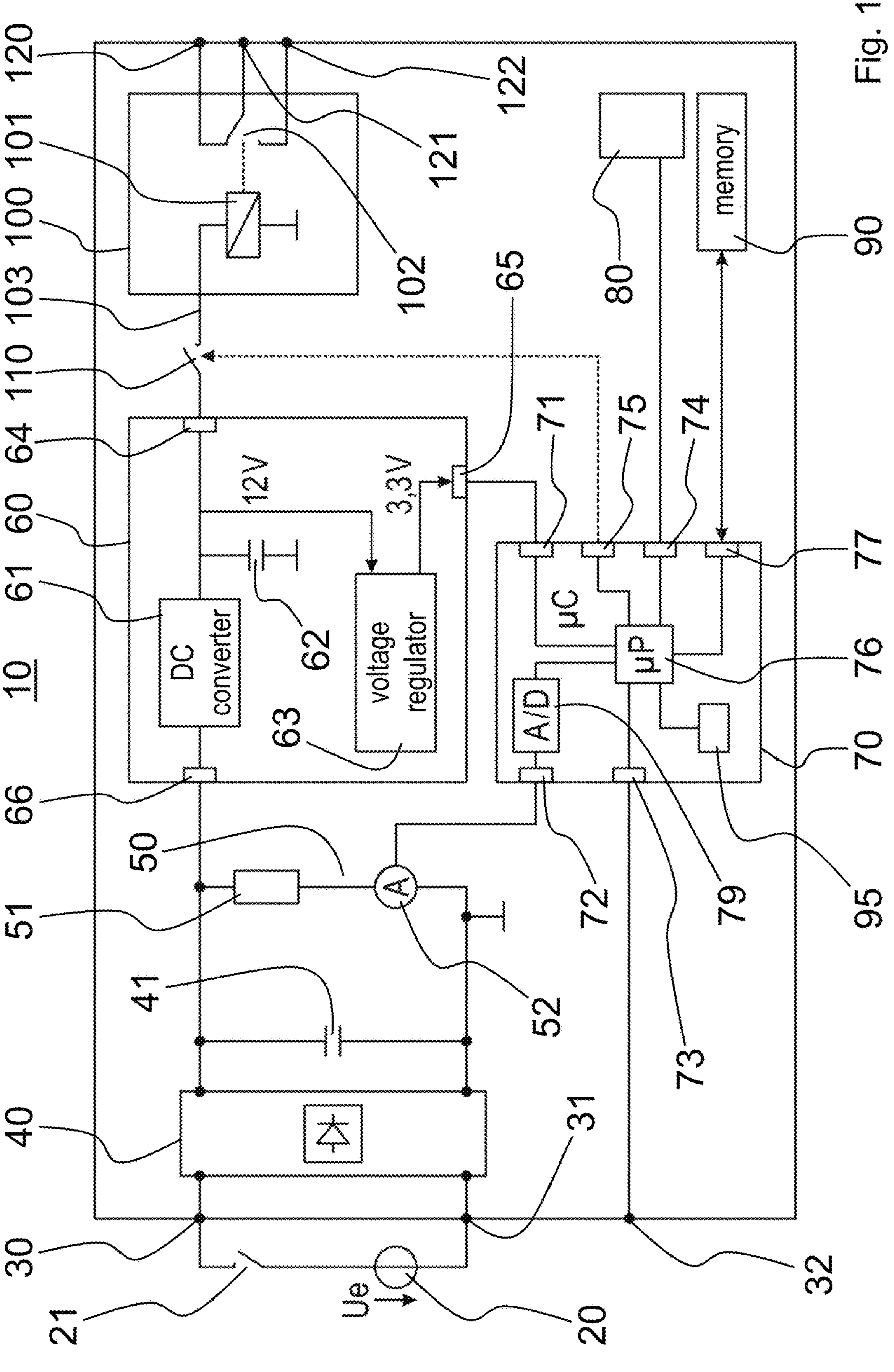
FIG. 1 shows the block diagram of an exemplary switching device in which the invention is implemented, and FIG. 2 the block diagram of a further exemplary switching device in which the invention is implemented.

FIG. 1 shows the block diagram of an exemplary switching device 10, which is configured in particular for operating with different input control voltages. The switching device 10 is preferably configured as a self-learning switching device, as will be explained in more detail below.

The switching device 10 has a first input terminal 30 and a second input terminal 31, to which an input control voltage, for example in the form of a DC voltage or an AC voltage, can be applied. It should be noted that the input terminal 31 can preferably serve as a ground terminal. By way of example only, a DC voltage source 20 can be connected to the two input terminals 30 and 31 via a switch 21. In the event that an AC voltage is also to be applied as the input control voltage, a bridge rectifier 40 can be implemented in the switching device 10, which can be connected to the two input terminals 30 and 31. To smooth the output voltage of the bridge rectifier 40, a smoothing capacitor 41 can be connected in parallel to the output of the bridge rectifier 40.

Furthermore, a current measurement path 50 is electrically connected to the two input terminals 30 and 31. The current measurement path 50, if present, is arranged downstream of the bridge rectifier 40 and has an electrical resistor with a predetermined resistance value and a current sensor 52 connected in series therewith, which is configured to measure a current flowing through the current path 50. An input control voltage that can be applied to the input terminals 30 and 31 is fed to a voltage supply device 60. For this purpose, the voltage supply device 60 is electrically connected to the input terminals 30 and 31. The voltage supply device 60 can comprise a direct current voltage converter 61, also called a DC converter, which converts an input control voltage applied to the input terminals 30 and 31 into a DC voltage of 12 V, for example. A smoothing capacitor 62 may be provided at the output of the DC converter 61. The DC output voltage generated by the DC converter 61 is supplied to a first output 64 of the voltage supply device 60. Furthermore, the DC output voltage of the DC converter 61 is fed to a voltage regulator 63 which, for example, generates a supply voltage for a control and evaluation device 70 from the 12 V DC voltage. For this purpose, the voltage regulator 63 converts the DC input voltage of 12 V, for example, into a 3.3 V output voltage, which is supplied to a voltage supply terminal 71 of the control and evaluation device 70 via an output 65 of the voltage supply device 60. Thanks to the voltage supply device 60, the switching device 10 can be operated via only a two-wire line, since both the microcontroller 70 and the electromechanical switch 100 are supplied via the input control voltage applied to the input terminals 30 and 31.

The control and evaluation device 70 can preferably be provided as a microcontroller. The microcontroller 70 may further comprise an analog input 72, which is connected to an output of the current sensor 72. The analog input 72 is connected to an analog-to-digital converter 79, referred to as A/D converter for short, of the microcontroller 70. The A/D converter 79 converts the analog current values measured by the current sensor 52 into digital current values. In a manner known per se, the microcontroller 70 can comprise a microprocessor 76 and a memory 95 in which, for example, firmware for controlling and monitoring the switching device 10 is stored. The output of the A/D converter 79 is connected to the microcontroller 70 on the input side.

According to an exemplary embodiment, the switching device 10 comprises a switching unit 100 configured as an electromechanical switch. The electromechanical switch 100 can be provided as a relay or contactor, for example. The electromechanical switch 100 comprises an excitation coil 101 arranged in a control circuit 103, which is electrically connected in series with a controllable switching element 110. The switching element 110 is provided, for example, as a separate component that can be connected upstream or downstream of the excitation coil 101. The control circuit 103 is electrically connected to the output 64 of the voltage supply device 60. As shown in FIG. 1, the switching element 110 can be connected between the connection 64 and the excitation coil 101. In a manner known per se, at least one switching element 102 of the switching unit 100 is coupled to the excitation coil 101. The switching element 102 can, for example, be provided as an on/off switch or as a changeover switch, as exemplary shown in FIG. 1. According to the exemplary implementation, the switching device 10 according to FIG. 1 has three output terminals 120-122, to which two load circuits can be connected, which can be switched on or off by means of the switching element 102.

Figure 2:
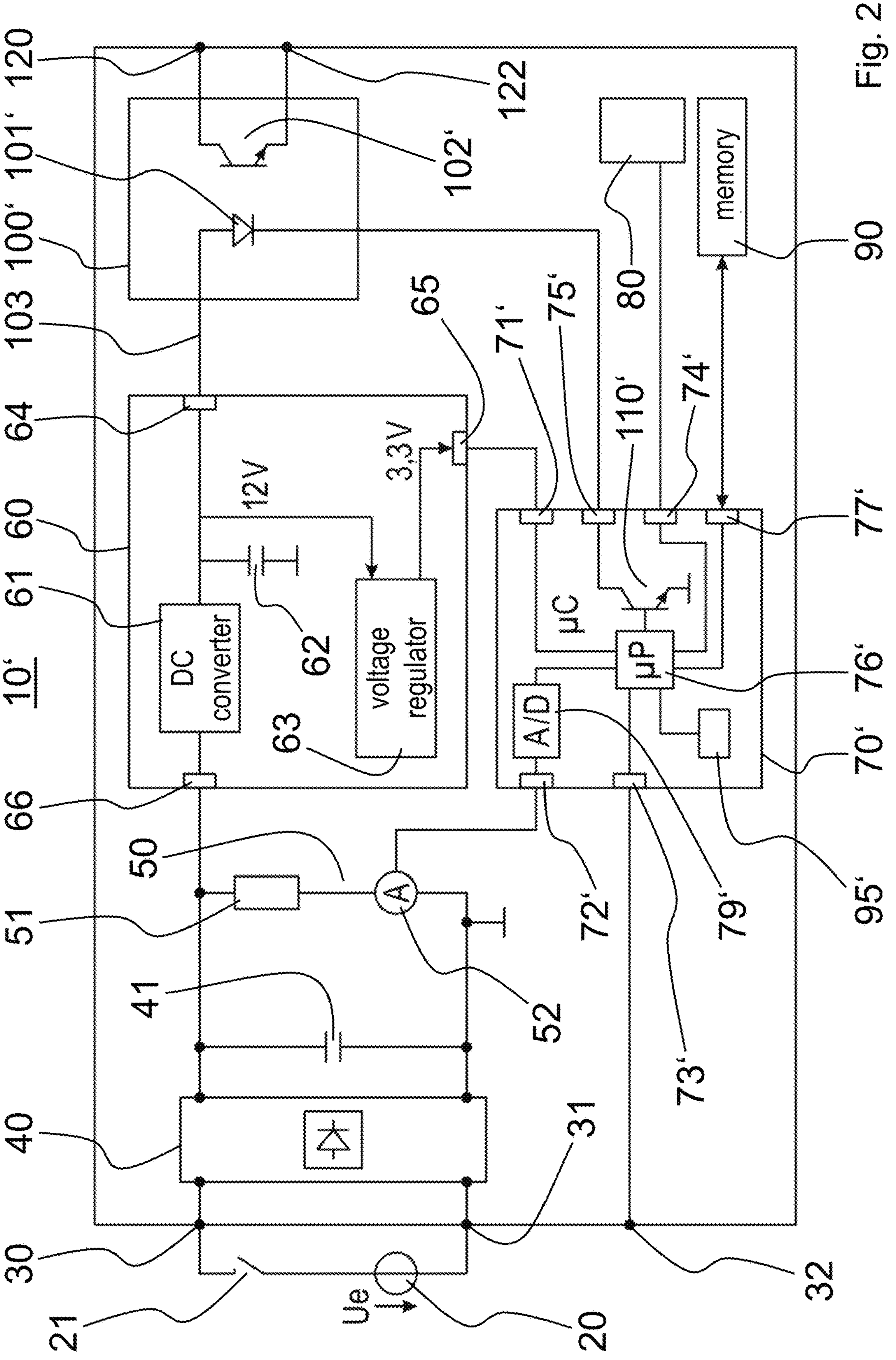

Instead of the electromechanical switch 100, a switching unit 100' provided as an optocoupler can be implemented in the switching device 10. This is illustrated in FIG. 2 with another exemplary switching device 10' in which the optocoupler 100' is implemented. The components of the switching device 10', which correspond to the components of the switching device 10 according to the exemplary embodiments, have been provided with the same reference signs. In a manner known per se, the optocoupler 100' can comprise a light-emitting diode as optical transmitter 101' and a photodiode as optical receiver 102'. In this case, the optical transmitter 101' is connected into the control circuit 103. The optical receiver 102' is connected to the output terminals 120 and 122 of the switching device 10', to which a load circuit (not shown) can be connected. The output of the optocoupler 100' can, for example, be provided as a transistor, as shown in FIG. 2, as a triac or thyristor.

Furthermore, for example, an optical and/or acoustic output device 80 can be implemented in the switching device 10, which is preferably electrically connected to a digital output 74 of the microcontroller 70. The optical and/or acoustic output device 80 has the task of signaling to an operator the input control voltage currently applied to the switching device 10 as well as the associated switch-on and switch-off voltage threshold values, which may be stored in the memory 95.

Furthermore, the switching device 10 can expediently comprise a separate memory device 90, which can be provided as an EEPROM. For example, a look-up table can be stored in the memory device 90, which respectively assigns a switch-on voltage threshold value and a switch-off voltage threshold value to different predefined input control voltages. For example, voltage values of 24 V, 48 V, 60 V, 120 V and 230 V can be stored as predefined input control voltages. As already mentioned at the beginning, depending on the implementation of the switching device 10, AC voltages and/or DC voltages can be processed by the switching device 10 as input control voltages. Only for the sake of simple explanation, it is assumed that the DC voltage values of 24V, 48V and 60V and the respective associated predeterminable switch-off and switch-on voltage threshold values are stored in the memory device 90. Alternatively or additionally, these values can also be stored in the memory 95 integrated in the microcontroller 70. In this case, the separate memory device 90 could be dispensed with.

According to the exemplary embodiment shown in FIG. 1, the control/evaluation device 70, provided as a microcontroller, has a further preferably digital output terminal 75, via which a control signal can be fed to the controllable switching element 110 in the form of an activation signal or a deactivation signal for switching the switching element 110 on or off.

Furthermore, according to the exemplary embodiment, the microcontroller 70 preferably has a terminal 77 via which the microcontroller 70 or the microprocessor 76 can communicate with the memory device 90. Preferably, the control and evaluation device 70 and the memory device can be connected to each other via an SPI (Serial Peripheral Interface)-based bus. In this case, the terminal 77 is designed as an SPI-based interface, wherein the memory device 90 then also has an SPI-based interface. The microcontroller 70 is configured to transmit, for example, a request command which, among other things, transmits a determined voltage value corresponding to an applied input control voltage to the memory device 90 via the terminal 77 in order to request the memory device 90 to transmit the switch-on and switch-off voltage threshold value associated with this voltage value to the microcontroller 70. The control and evaluation device 70 can be configured to store the switch-on and switch-off voltage threshold values read out from the memory device 90 as currently provided switch-on and switch-off voltage threshold values in the memory 95 of the microcontroller 70.

It should be noted at this point that a controllable switching element 110' can also be used in the switching device 10 instead of the controllable switching element 110. This is illustrated in FIG. 2 using the exemplary switching device 10' as an example. The switching element 110' is preferably integrated as an open collector output in a microcontroller 70', as shown in FIG. 2. In this case, the emitter is connected to an internal ground of the microcontroller 70'. In this case, the microcontroller 70' has a terminal 75' to which the control circuit 103 or the optical transmitter 101' can be connected. If, on the other hand, the electromechanical switch 100 shown in FIG. 1 is used as the switching unit, the ground connection of the excitation coil 101 is connected to the terminal 75', whereas when the optocoupler 100' is used, the cathode connection of the optical transmitter 101' is connected to the terminal 75'. Otherwise, the microcontroller 70' can be configured similarly or essentially identically to the microcontroller 70 of the switching device 10. Thus, the microcontroller 70' can have a voltage supply terminal 71', a terminal 74', an analog input 72', a microprocessor 76', a memory 95' and a further input 73'. The mode of operation of the switching device 10 and the switching device 10' can preferably be essentially the same, so that the microcontroller 70 according to FIG. 1 could easily be replaced by the microcontroller 70'.

The switching device 10 can have a third input terminal 32, which can be connected to a further, preferably digital input 73 of the control and evaluation device 70. For example, an operator can apply a first control signal to the input 32 of the switching device 10 in order to be informed of the current configuration, i.e. the input control voltage currently used by the switching device 10. The microcontroller 70 is configured to evaluate the first control signal arriving at the input 73 and to transmit a corresponding control signal via the output 74 to the optical and/or acoustic output device 80, which then outputs the currently configured input control voltage to an operator in optical or acoustic form. For this purpose, predetermined codes, for example digits, can be used, to each of which one of the predetermined input control voltages and the respective associated switch-on and switch-off voltage threshold values are assigned. For example, the digit 1 can be assigned to an input control voltage of 24V, the digit 2 to an input control voltage of 24V and the digit 3 to an input control voltage of 48V. Preferably, the optical and/or acoustic output device 80 is then configured to output, depending on the respective digit, a corresponding number of flashing pulses and/or a corresponding voice message.

For example, a reset signal can be applied to the input connection 32 as a second control signal, which is fed to the control and evaluation device 70 via the input 73. The control and evaluation device 70 can be configured to delete or reset the switch-on and switch-off voltage threshold values currently stored in the memory 95 in response to the reset signal.

The function and mode of operation of the switching device 10 shown as an example in FIG. 1 is explained in more detail below.

Let us now assume that three possible DC voltages are stored in the memory 90 as input control voltage values, for example 24 V, 48 V and 60 V, as well as the respective associated switch-on voltage threshold values and switch-off voltage threshold values, for example in the form of a look-up table. These three voltage values are also conveniently stored as reference values in the memory 95 of the microcontroller 70. It is also assumed that the switching device 10 is to be put into operation for the first time.

To do this, for example, the external DC voltage source 20, which for example supplies a DC voltage of 24 V, is connected to the input terminals 30 and 31 and the switch 21 is closed. After the switch 21 is closed, the current in the current measurement path 50 caused by the input control voltage is measured by the current sensor 52. The electrical resistor 51 in series with the current sensor 57, which is preferably of low resistance and whose value is known, is preferably used to set a base load current through the current path 50 in order to minimize susceptibility to interference from external influences. The resistance value of the resistor 51 is, for example, stored in the memory 95 and thus, together with the three reference values of 24V, 48V and 60V, is known to the microcontroller 70 or the microprocessor 76. The analog value measured by the current sensor 52 is fed to the A/D converter 79 of the microcontroller 70 via the analog input 72. The microprocessor 76 of the microcontroller 70 is programmed in such a way that it determines a voltage value depending on the digital current measurement value received via the A/D converter 79 and the known resistance value of the electrical resistor 51. The microcontroller 70 or the microprocessor 76 can preferably be configured to check whether the determined voltage value can be associated with one of the reference values stored in the memory 95. In the present case, the microprocessor 76 recognizes that the determined voltage value can be associated with the reference value 24V.

The microcontroller 70 or the microprocessor 76 implemented therein is programmed such that it transmits the detected reference value of 24V via the output 77 to the memory device 90 and causes the memory 90 to transmit the switch-on and switch-off voltage threshold values associated with the transmitted reference value back to the microcontroller 70 and to make them available to the microcontroller 70 for further use. The switch-on and switch-off voltage threshold values arriving at terminal 77 are, for example, stored in the memory 95 of the microcontroller 70 as the switch-on and switch-off voltage threshold values currently to be used. In other words: Upon completion of the initial start-up, the switching device 10 has automatically configured itself with respect to the input control voltage applied to the input terminals 30 and 31.

It should be noted that, during operation, the current sensor 52 preferably continuously measures the current through the current measurement path 50 and transmits the measured current values to the microcontroller 70 at regular intervals, preferably almost continuously.

If, after the initial start-up, the microcontroller 70 determines that the DC voltage of 24V applied to the input terminals 30 and 31 is present continuously for a defined period of time—i.e. the microprocessor 76 determines a voltage value during this period of time which is greater than or equal to the switch-on voltage threshold value stored in the memory 95—the microcontroller 70 or the microprocessor 76 applies an activation signal to the digital output 75, which ensures that the switching element 110 is closed. As a result, the output voltage of, for example, 12V applied to the output 64 of the DC converter 61 is fed to the electromechanical switch 100 or the excitation coil 101, so that the switching element 102 of the electromechanical switch 100 is switched accordingly. In the embodiment shown, a current-carrying excitation coil 101 ensures that the switch 102 closes a load circuit at the terminals 120 and 121.

In an advantageous manner, the microcontroller 70 is configured to transmit a corresponding control signal, for example a binary-coded 1, to the optical and/or acoustic output device 80 via the output 74 after initial start-up. The optical and/or acoustic output device 80 is configured to evaluate the binary-coded 1 and to output the digit 1 to an operator, for example by means of a single flashing pulse and/or a corresponding voice output. The digit 1 output in this way signals to an operator that the switching device 10 is currently being operated with an input control voltage of 24V.

The electromechanical switch 100 remains in switching state 1, i.e. current flows through the excitation coil 101, until the input control voltage at the input terminals 30 and 31 falls below the switch-off voltage threshold value stored in the memory 95. The microcontroller 70 recognizes this by the fact that the current through the current path 50, which is continuously measured by the current sensor 52, drops, so that the microprocessor 76 determines a voltage value that is below the switch-off voltage threshold value stored in the memory 95. In response to this, the microprocessor 76 applies a deactivation signal to the digital output 75. In response to the deactivation signal, the switching element 110 is opened. At this moment, the excitation coil 101 is no longer energized and the electromechanical switch 100 goes into a second switching state, in which a second load circuit (not shown), which is connected to the terminals 121 and 122, is now closed via the switch 102, while the first load circuit (not shown) is opened.

As already mentioned above, according to an advantageous embodiment, an operator can apply a first control signal to the input 32 of the switching device 10 in order to be informed of the current configuration, i.e. the input control voltage currently used by the switching device 10. The microcontroller 70 is configured to evaluate a respective control signal arriving at the input 73 and to transmit a corresponding control signal, in the present exemplary embodiment a binary-coded 1, via the output 74 to the optical and/or acoustic output device 80. The optical and/or acoustic output device 80 is configured to evaluate the binary-coded 1 and to output the digit 1 to an operator, for example by means of a single flashing pulse and/or a corresponding speech output. The digit 1 output in this way signals to an operator that the switching device 10 is currently being operated with an input control voltage of 24V.

An operator can apply a second control signal, a so-called reset signal, to the input 73 of the microcontroller 70 via the input 32. As already explained above, the microcontroller 70 or the microprocessor 76 is configured to delete the switch-on and switch-off voltage threshold values currently stored in the memory 95 in response to a reset signal.

If, after a reset of the switching device 10, an input control voltage is again applied to the input terminals 30 and 31 of the switching device 10, for example an input control voltage of 48V, the configuration procedure described above with regard to the initial startup is carried out again, so that at the end of a proper configuration phase, the switch-on and switch-off voltage threshold values associated with the reference value of 48V are read out from the memory 90 by the microcontroller 70 and stored in the memory 95 as the current switch-on and switch-off voltage threshold values.

The exemplary switching device 10 can also be operated in a so-called self-learning mode, in which the switching device 10 automatically reconfigures itself, i.e. adjusts itself to a new input control voltage value and to the associated switch-on and switch-off voltage threshold values.

It is now assumed that the switching device 10 is configured to an input control voltage value of 24 V and the associated switch-on and switch-off voltage threshold values stored in the memory 95 in accordance with the initial startup described above. As mentioned above, the sensor 52 is configured to continuously measure the current through the current path 50 during an input control voltage being applied to the input terminals 30 and 31, wherein the measured current value is fed to the microprocessor 76 of the microcontroller 70 via the A/D converter 79. The microcontroller 70 or the microprocessor 76 is configured to determine a voltage value at regular intervals, or almost continuously, from the measured current values arriving at the input 72 and to check whether the determined voltage value can be associated with one of the three stored reference values, i.e. 24V, 48V and 60V.

Now it is assumed that during operation, the input control voltage applied to the input terminals 30 and 31 is increased from 24 V to 48 V, for example. This means that the switching element 110 is still closed and the excitation coil 101 is energized.

It is assumed now that the changed input control voltage, in the present case the new input control voltage 48V, is present for at least a predetermined period of time and the current sensor 52 measures a correspondingly increased current value for the predetermined period of time, which is fed to the microprocessor 76 via the input 72 and the A/D converter 79. In this case, the microprocessor 76 determines voltage values during the predefined time and recognizes that, during the predetermined period of time, the determined voltage values can all be associated with the reference value of 48V stored in the memory 95. In response to this, the microprocessor 76 requests the memory device 90 via the terminal 77 to transmit the switch-on and switch-off voltage threshold values associated with the reference value of 48V. The microcontroller 70 or the microprocessor 76 is programmed, for example, such that it deletes the switch-on and switch-off voltage threshold values associated with the old input control voltage of 24 V and replaces them with the new switch-on and switch-off voltage threshold values, or overwrites the old switch-on and switch-off voltage threshold values in the memory 95 with the new received switch-on and switch-off voltage threshold values associated with the input control voltage of 48 V.

The exemplary switching device 10 is thus capable of detecting in a self-learning manner, i.e. automatically, whether a new input control voltage has been applied to the input terminals 30 and 31 during operation. In response to this, the switching device 10 configures itself, i.e. the microcontroller 70 ensures that the switch-on and switch-off voltage threshold values associated with the new input control voltage of 48 V are now activated by writing them to the memory 95. This means that if the current input control voltage of 48 V applied to the input terminals 30 and 31 falls below the switch-off voltage threshold value associated with it, the microcontroller 70 detects this and then opens the switching element 110.

As already mentioned, the functionality of the switching device 10 remains essentially unchanged if in the switching device 10 the microcontroller 70' is implemented instead of the microcontroller 70 and/or the optocoupler 100' is implemented instead of the electromechanical relay 100.

The invention claimed is:

1. A switching device, in particular for operating with different input control voltages, comprising:

a first and a second input terminal for applying an input control voltage (20), a current measurement path connected to the first and second input terminals, the current measurement path having a predetermined electrical resistor and a current sensor connected in series therewith, the current sensor being configured to measure a current flowing through the current path, a switching unit which is configured to close and open at least one load circuit and is electrically connected to a control circuit, a controllable switching element which is designed to close and open the control circuit, a control and evaluation device which has a first input which is electrically connected to the current sensor, a memory device which is electrically connected to the control and evaluation device and in which an assignment table is stored which assigns a switch-on voltage threshold value and a switch-off voltage threshold value to each predetermined input control voltage value from a plurality of n different predetermined input control voltage values, wherein the control and evaluation device is configured to, i) determine a voltage value depending on a current value measured by the current sensor and the predetermined electrical resistor and check whether the determined voltage value can be associated with one of the n different predetermined input control voltage values, and if so;

ii) depending on the predetermined input control voltage value associated with the determined voltage value, read out the associated switch-on voltage threshold value and the associated switch-off voltage threshold value from the memory device and provide them as the current switch-on and switch-off threshold value, respectively.

2. The switching device according to claim 1, further comprising:

a voltage supply device having a first and a second output, wherein the voltage supply device is configured to generate a first predetermined DC supply voltage and a second predetermined DC supply voltage when an input control voltage is applied to the first and second input terminals and to provide the first predetermined DC supply voltage at the first output and the second predetermined DC supply voltage at the second output, wherein;

the control and evaluation device has a voltage supply terminal which is electrically connected to the second output of the voltage supply device, the switching unit being electrically connected to the first output via the control circuit.

3. The switching device according to claim 1, wherein the control and evaluation device is configured to generate an activation signal if, after execution of step ii), a voltage value determined by the control and evaluation device depending on a current value measured by the current sensor is greater than or equal to the switch-on voltage threshold value stored as the current value, wherein the controllable switching element is configured to close the control circuit in response to the activation signal, and wherein the control and evaluation device is configured to generate a deactivation signal if, after execution of step ii), a voltage value determined by the control and evaluation device depending on a current value measured by the current sensor is less than or equal to the currently stored switch-off voltage threshold value, wherein the controllable switching element is configured to open the control circuit in response to the deactivation signal.

4. The switching device according to claim 1, wherein the controllable switching element is an integral component of the control and evaluation device.

5. The switching device according to claim 3, wherein:

the controllable switching element is configured as a separate component, and wherein:

the control and evaluation device has a control output for applying the activation signal or the deactivation signal, the control output being electrically connected to a terminal of the controllable switching element.

6. The switching device according to claim 1, wherein the control and evaluation device is configured to, after carrying out steps i) and ii), continuously determine a voltage value depending on a current value measured by the current sensor and to check whether this determined voltage value can be associated with a different one of the n different predetermined input control voltage values, and if so read out the associated switch-on voltage threshold value and the associated switch-off voltage threshold value from the memory device depending on the predetermined input control voltage value associated with the determined voltage value and to provide them as new current switch-on and switch-off threshold values.

7. The switching device according to claim 1, wherein the switching device has a third input terminal which is electrically connected to a second input of the control and evaluation device, wherein the control and evaluation device is configured to delete the switch-on and switch-off voltage threshold values stored as current switch-on and switch-off threshold values in response to a first control signal, which can be applied to the third input terminal, and then to repeat steps i) and ii).

8. The switching device according to claim 1, wherein the switching device has an optical and/or acoustic output device, wherein the control and evaluation device is configured to cause the switching device to output, via the optical and/or acoustic output device, optical and/or acoustic information which represents the switch-on and switch-off voltage threshold values stored as current switch-on and switch-off threshold values and/or the associated predetermined input control voltage value.

9. The switching device according to claim 8, wherein:

the switching device has a third input terminal which is electrically connected to a second input of the control and evaluation device, wherein the control and evaluation device is configured to delete the switch-on and switch-off voltage threshold values stored as current switch-on and switch-off threshold values in response to a first control signal, which can be applied to the third input terminal, and then to repeat steps i) and ii), and wherein;

the control and evaluation device is configured to cause the switching device, in response to a second control signal, which can be applied to the third input terminal, to output, via the optical and/or acoustic output device, optical and/or acoustic information which represents the switch-on and switch-off voltage threshold values stored as current switch-on and switch-off threshold values and/or the associated predetermined input control voltage value.

10. The switching device according to claim 1, wherein the controllable switching element is provided as a semiconductor switch and the switching unit is provided as an electromechanical switch or as an optocoupler.

11. The switching device according to claim 10, wherein the switching device comprises at least two output terminals connected to the electromechanical switch for connecting at least one load circuit.

12. The switching device according to claim 10, wherein the electromechanical switch has an excitation coil connected in series with the controllable switching element.

13. The switching device according to claim 1, wherein the control and evaluation device is provided as a microcontroller.

14. The switching device according to claim 1, wherein the memory device is an integral component of the control and evaluation device.

* * * * *